(12) United States Patent
Nakamura et al.

(10) Patent No.: US 6,966,964 B2
(45) Date of Patent: Nov. 22, 2005

(54) METHOD AND APPARATUS FOR MANUFACTURING SEMICONDUCTOR DEVICE

(75) Inventors: Koujiro Nakamura, Ibaraki (JP); Yoshihiko Yagi, Ashiya (JP); Michiro Yoshino, Settsu (JP); Kazuto Nishida, Katano (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 243 days.

(21) Appl. No.: 10/328,189

(22) Filed: Dec. 26, 2002

(65) Prior Publication Data

US 2003/0138993 A1    Jul. 24, 2003

(30) Foreign Application Priority Data

Dec. 26, 2001  (JP) ............................. 2001-392970

(51) Int. Cl.[7] ............................................. B32B 31/00
(52) U.S. Cl. ............................. 156/275.5; 156/306.3; 156/308.2; 438/119
(58) Field of Search .................. 156/306.3, 308.2, 156/272.2, 275.5, 275.7; 438/118, 119; 29/832, 29/739, 740, 741; 257/778, 783

(56) References Cited

U.S. PATENT DOCUMENTS

| 5,366,933 | A | * | 11/1994 | Golwalkar et al. | ........... 29/827 |
| 6,071,371 | A | * | 6/2000 | Leonard et al. | ............. 156/297 |
| 6,072,243 | A | * | 6/2000 | Nakanishi | ................... 257/783 |
| 2002/0079594 | A1 | * | 6/2002 | Sakurai | ...................... 257/778 |

* cited by examiner

*Primary Examiner*—John T. Haran
(74) *Attorney, Agent, or Firm*—Steptoe & Johnson LLP (57) ABSTRACT

A method for manufacturing a semiconductor device whereby semiconductor elements like semiconductor bare chips are mounted with high productivity on both surfaces of a circuit board while preventing the board from warping, and an apparatus for manufacturing a semiconductor device for faithfully embodying the manufacturing method. Semiconductor elements temporarily fixed on both surfaces of a circuit board are heated while being pressurized in directions to be each pressed against the board, whereby adhesive on both surfaces of the board is thermally set simultaneously and bumps on each semiconductor elements are pressbonded to their opposing board electrodes on the board to be electrically connected. Ultraviolet rays are irradiated to a circumference of mixed curing adhesive applied to at least one surface of the circuit board to form an ultraviolet curing part only on the circumference of the adhesive, thereby increasing strength for temporarily fixing the semiconductor elements to the circuit board.

5 Claims, 5 Drawing Sheets

METHOD AND APPARATUS FOR MANUFACTURING SEMICONDUCTOR DEVICE

FIELD OF THE INVENTION

The present invention relates to a method for manufacturing a semiconductor device on which semiconductor bare chips are directly mounted on both surfaces of a circuit board by flip-chip packaging method, and an apparatus for manufacturing the semiconductor device that can be suitably used for embodying the manufacturing method.

BACKGROUND OF THE INVENTION

In recent years, a smaller size and a smaller thickness have been demanded for electric equipment such as portable information equipment. Accordingly, a higher package density has been required for electronic circuits. As means for increasing a density of an electronic circuit, instead of conventional IC packages, the field of flip-chip packaging method has remarkably developed, in which a semiconductor bare chip having a wafer divided into pieces is reversed upside down and is directly mounted on a circuit board. For example, packaging and modules currently produced by the flip-chip packaging method include CSP (Chip Size Package) in which packaging is made in the same size as a semiconductor bare chip and MCM (Multi Chip Module) in which a plurality of semiconductor bare chips are mounted on a circuit board. The production of these methods has increased. In SBB (Stud Bump Bonding) which is one of the flip-chip packaging methods, wire bonding method is applied to form bumps on electrode pads of a semiconductor bare chip and leveling is performed by a leveling device for leveling the bump heads of the bumps, so that stud bumps of two-stepped protrusions are formed, each having a bump base and a bump head.

Figure 5A:
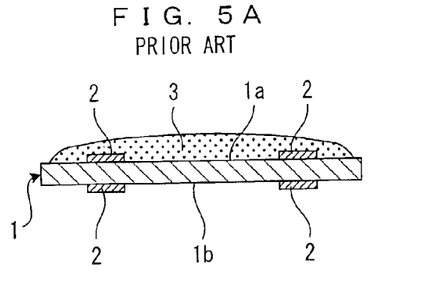
FIGS. 5A to 5G are longitudinal sectional views showing, in a sequential order, manufacturing processes of a semiconductor bare chip-mounted module according to a prior art, the module having semiconductor bare chips mounted on both surfaces of a circuit board by flip-chip method.

Further, in recent years, techniques have been developed for mounting semiconductor bare chips on both surfaces of a circuit board by flip-chip method. FIGS. 5A to 5G are longitudinal sectional views showing a conventional manufacturing process of a semiconductor bare chip mounted module in the order of steps. The semiconductor bare chip mounted module has semiconductor bare chips mounted on both surfaces of a circuit board by flip-chip method. First, as shown in FIG. 5A, a thermosetting adhesive 3 made of epoxy is applied to board electrodes 2 on a first mounting surface 1a of a circuit board 1. The board electrodes 2 are formed on predetermined positions of circuits on both surfaces of the circuit board 1.

Figure 5B:
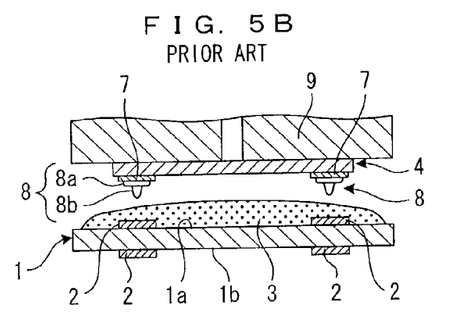

Meanwhile, as shown in FIG. 5B, on a semiconductor bare chip 4 to be mounted, stud bumps 8 (protruding electrodes) of two-stepped protrusions are formed on electrode pads 7 provided on one surface of the semiconductor bare chip 4. The stud bump 8 has a bump base 8a which is fused with the material of the electrode pad 7 so as to be firmly fixed as an alloy on the electrode pad 7 and a bump head 8b which is formed on the bump base 8a. The semiconductor bare chip 4 is sucked and held by a vacuum suction head 9 and is conveyed over the circuit board 1, and then, the semiconductor bare chip 4 is lightly pressed onto the thermosetting adhesive 3 and is temporarily fixed in a state that the stud bumps 8 are aligned with the board electrodes 2.

Figure 5C:
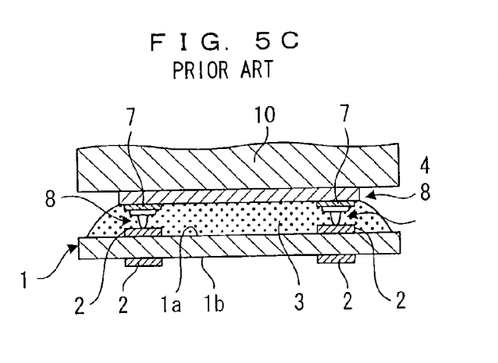
Figure 5D:
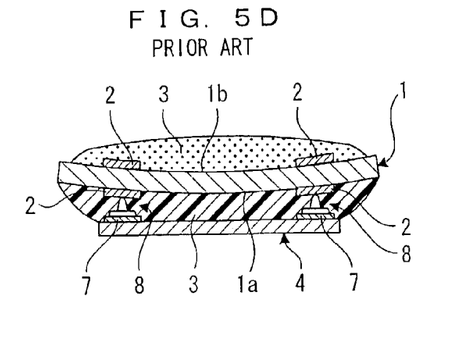

The circuit board 1 having the semiconductor bare chip 4 is temporarily fixed is conveyed to the subsequent step after the vacuum suction head 9 is separated. In the subsequent step, as shown in FIG. 5C, a pressure-heating head 10 is pressed and heated onto the temporarily fixed semiconductor bare chip 4 for about thirty seconds. Thus, as shown in FIG. 5D, the thermosetting adhesive 3 is thermally set and contracted, the contraction force permits the semiconductor bare chip 4 to be entirely attracted to the first mounting surface 1a of the circuit board 1, and the bump heads 8b of the stud bumps 8 are press-bonded and electrically connected to the corresponding board electrodes 2. Moreover, the semiconductor bare chip 4 is firmly bonded to the first mounting surface 1a via the adhesive 3 which is filled entirely into a gap between the semiconductor bare chip 4 and the first mounting surface 1a of the circuit board 1. In this way, mounting of the semiconductor bare chip 4 onto the first mounting surface 1a of the circuit board 1 is completed.

Figure 5E:
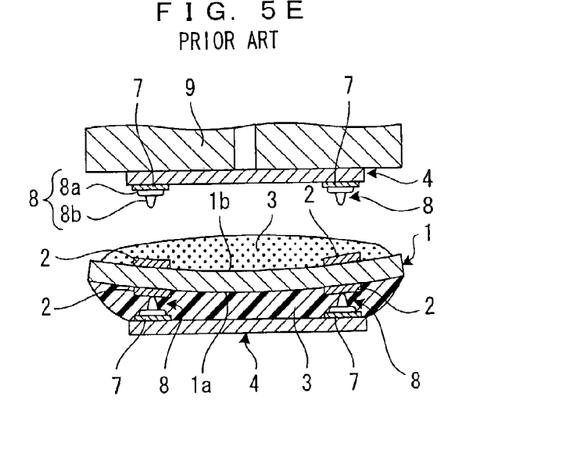
Figure 5F:
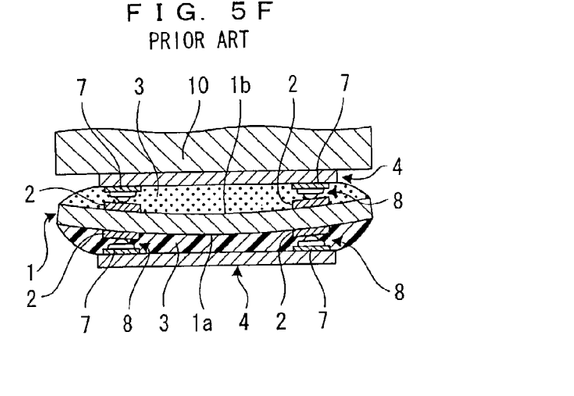
Figure 5G:
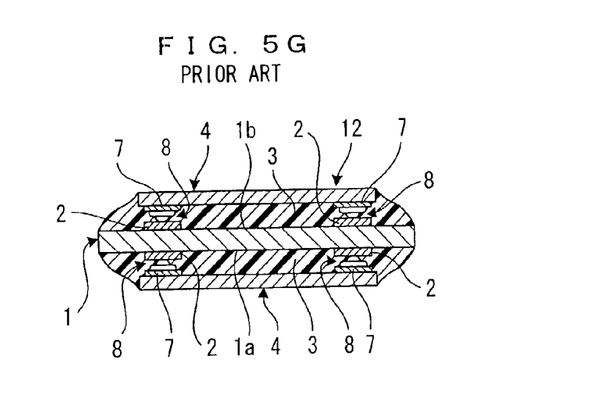

Subsequently, as shown in FIG. 5D, after the circuit board 1 is reversed upside down and the thermosetting adhesive 3 is applied to a second mounting surface 1b of the circuit board 1, the same mounting process as that of the first mounting surface 1a is performed. Namely, as shown in FIG. 5E, another semiconductor bare chip 4 which is sucked and held by the vacuum suction head 9 is pressed onto the thermosetting adhesive 3 and is temporarily fixed. Next, as shown in FIG. 5F, the pressure-heating head 10 is pressed onto the temporarily fixed semiconductor bare chip 4 for about thirty seconds in a heating state. Hence, as shown in FIG. 5G, the semiconductor bare chip 4 is mounted on the second mounting surface 1b via the thermosetting adhesive 3, and a semiconductor bare chip mounted module 12 is completed in which the semiconductor bare chips 4 are flip-chip mounted on the surfaces 1a and 1b of the circuit board 1.

However, in the above conventional method for manufacturing the semiconductor bare chip mounted module 12, as illustrated in FIG. 5D in an exaggerated manner, the circuit board 1 is deformed in a warping direction to the second mounting surface 1b due to the contraction force of a thermosetting resin after adhesive in the thermosetting adhesive 3 is cured on the first mounting surface 1a. For this reason, when the deformed circuit board 1 is reversed upside down and the semiconductor bare chip 4 is mounted on the second mounting surface 1b by using the pressure-heating head 10, stress is applied to the joints between the board electrodes 2 on the circuit board 1 and the stud bumps 8 of the semiconductor bare chip 4 mounted on the first mounting surface 1a, resulting in problems such as degradation in quality of the joints and bonding defects. Further, when the semiconductor bare chip 4 is mounted on the second mounting surface 1b, in the case where a relatively large warp occurs on the circuit board 1, a serious problem may arise that electrical connection cannot be made between the stud bumps 8 and the board electrodes 2 due to a displacement of the semiconductor bare chip 4, resulting in lower yields.

The present invention is devised in view of the above conventional problem and has as its objective the provision of a method for manufacturing a semiconductor device whereby semiconductor elements such as semiconductor bare chips can be mounted with high productivity on both surfaces of a circuit board in such a manner as to prevent a warp on the circuit board, and an apparatus for manufacturing a semiconductor device whereby the manufacturing method can be faithfully embodied.

SUMMARY OF THE INVENTION

In order to attain the above-described objective, a method for manufacturing a semiconductor device according to the present invention is characterized by comprising the steps of applying a thermosetting adhesive to one surface of a circuit board, temporarily fixing a semiconductor element on the surface via the adhesive in a state that bumps on the semiconductor element are aligned with board electrodes on the circuit board, reversing upside down the circuit board having the semiconductor element temporarily fixed thereon, applying a thermosetting adhesive to the other surface of the circuit board, temporarily fixing another semiconductor element on the other surface via the adhesive in a state that bumps on the another semiconductor element are aligned with board electrodes on the circuit board, and thermally setting the adhesive simultaneously on both surfaces of the circuit board by heating the semiconductor elements temporarily fixed on both surfaces of the circuit board while applying pressure to the semiconductor elements in directions of pressing them to the circuit board, and press-bonding the bumps on the semiconductor elements to the opposing board electrodes on the circuit board into an electrical connected state.

In this method for manufacturing a semiconductor device, since the thermosetting adhesive for temporarily fixing the semiconductor elements on both surfaces of the circuit board is simultaneously heated and thermally set, the contraction forces in the resin of the adhesive are applied evenly on both surfaces of the circuit board so that warps appear in opposite directions with respect to the circuit board during the thermal setting, and thus the contraction forces cancel each other. As a result, no warp appears on the circuit board and thus the bumps on the semiconductor elements and the board electrodes on the circuit board are accurately aligned with each other without displacements on both surfaces of the circuit board and positively make electrical connection. Furthermore, since the press-bonding step of heating and pressurizing the semiconductor elements can be performed while preventing the occurrence of a warp on the circuit board, no stress appears on joints between the bumps and the board electrodes on both surfaces of the circuit board, thereby preventing problems such as degradation in quality and bonding defects. In addition, the semiconductor elements can be temporarily fixed on both surfaces of the circuit board successively in the same step, and the press-bonding step of heating and pressurizing the semiconductor elements on both surfaces of the circuit board needs be performed just one time, thereby to manufacture a semiconductor device with extremely high productivity.

Another method for manufacturing a semiconductor device according to the present invention is characterized by comprising the steps of applying a mixed curing adhesive to one surface of a circuit board, the adhesive being made by mixing a thermosetting adhesive and an ultraviolet curing adhesive, temporarily fixing a semiconductor element on the surface via the adhesive in a state that bumps on the semiconductor element are aligned with board electrodes on the circuit board, forming an ultraviolet curing part only on the circumference of the adhesive by irradiating the circumference of the adhesive with ultraviolet rays, reversing upside down the circuit board having the semiconductor element temporarily fixed thereon, applying a thermosetting adhesive to the other surface of the circuit board, temporarily fixing another semiconductor element on the other surface via the thermosetting adhesive in a state that bumps on the another semiconductor element are aligned with board electrodes on the circuit board, and thermally setting the adhesive simultaneously on both surfaces of the circuit board by heating the semiconductor elements temporarily fixed on both surfaces of the circuit board while applying pressure to the semiconductor elements in directions of pressing them against the circuit board, and press-bonding the bumps on the semiconductor elements to the opposing board electrodes on the circuit board into an electrically connected state.

In this method for manufacturing a semiconductor device, in addition to the effect of the first invention, the ultraviolet curing part increases the temporary fixing strength of the semiconductor elements to the circuit board, whereby it is possible to positively prevent the semiconductor element from being displaced from one surface of the circuit board when reversing upside down the circuit board which has been completed with mounting of the semiconductor element on one surface thereof and when mounting the semiconductor element on the other surface of the circuit board.

Furthermore, the following operation is also applicable: instead of the thermosetting adhesive, the mixed curing adhesive made by mixing a thermosetting adhesive and an ultraviolet curing adhesive is applied to the other surface of the circuit board, another semiconductor element is temporarily fixed on the other surface via the mixed curing adhesive, and then, ultraviolet rays are irradiated toward the circumference of the mixed curing adhesive to form an ultraviolet curing part only on the circumference of the adhesive. Thus, the temporary fixing strength of the semiconductor elements temporarily fixed on both surfaces of the circuit board are increased, thereby more positively preventing the semiconductor elements from being displaced from the circuit board.

Moreover, it is preferable to simultaneously perform the step of temporarily fixing the semiconductor element on at least one surface of the circuit board via the mixed curing adhesive and the step of irradiating ultraviolet rays to the circumference of the mixed curing adhesive to form the ultraviolet curing part. Hence, it is not necessary to transfer the circuit board which has been completed with temporary fixing of the semiconductor element on one surface thereof to an ultraviolet irradiation step, and thus the productivity can be improved accordingly. Further, it is possible to eliminate the possibility that an impact at the transfer to the ultraviolet irradiation step causes displacements of the temporarily fixed semiconductor elements from the circuit board, whereby the reliability of the joints between the bumps and the board electrodes is further increased.

In the step of press-bonding the bumps on the semiconductor elements to the opposing board electrodes on the circuit board into an electrically connected state, it is preferable to apply pressure of 20 gf or more to each of the bumps provided on the semiconductor elements and to thermally set the adhesive interposed between the semiconductor elements and the circuit board while leveling the bumps and correcting a warp on the board. A load applied to the bumps via the semiconductor elements is required to be large enough to deform the bumps in order to absorb a warp on the board. The load needs to be 20 gf or more. The semiconductor elements, the bumps, the circuit board, and so on are not damaged at the upper limit of the load. In some cases, the maximum load exceeds 100 gf. Hence, it is possible to absorb a warp on the board and thus eliminate problems such as degradation in quality of the joints and bonding defects.

The semiconductor device of the present invention is formed by mounting semiconductor elements on both surfaces of a circuit board according to the manufacturing methods of the above invention and another invention. The semiconductor device has no warp on the circuit board, and thus bumps on the semiconductor element and board electrodes on the circuit board make electrical connection while being accurately aligned with each other without displacements.

An apparatus for manufacturing a semiconductor device according to the present invention is characterized by comprising a tool driven for sucking and holding a semiconductor element and pressing the semiconductor element against an adhesive applied to a circuit board, an ultraviolet irradiator located at a position for irradiating the circumference of the adhesive with ultraviolet rays when the semiconductor element sucked and held by the tool is pressed against the adhesive of the circuit board, a suction head integrally comprising a holder for holding the tool and the ultraviolet irradiator, and a pressure-heating head for heating the semiconductor element temporarily fixed onto the adhesive while pressing the semiconductor element in a direction of pressing it against the circuit board.

In this apparatus for manufacturing a semiconductor device, the suction head integrally comprises the ultraviolet irradiator, whereby it is possible to form an ultraviolet curing part in a mixed curing adhesive applied to the other surface of the circuit board without the necessity for a step of conveying the circuit board to an ultraviolet irradiation step, and thus the productivity can be improved. Further, it is possible to more positively prevent the semiconductor element from being displaced from the circuit board, thereby increasing the reliability of the joints between the bumps and the board electrodes.

As described above, with the method for manufacturing a semiconductor device according to the first invention, since no warp appears on the circuit board, the bumps on the semiconductor elements and the board electrodes on the circuit board are accurately aligned with each other without displacements on both surfaces of the circuit board and positively make electrical connection. Furthermore, since the press-bonding step of heating and pressurizing the semiconductor elements can be performed while preventing the occurrence of a warp on the circuit board, no stress appears on joints between the bumps and the board electrodes on both surfaces of the circuit board, thereby preventing problems such as degradation in quality and bonding defects. In addition, the semiconductor elements can be temporarily fixed on both surfaces of the circuit board successively in the same single step and the press-bonding step for heating and pressurizing the semiconductor elements on both surfaces of the circuit board can be performed at one time, thereby manufacturing a semiconductor device with extremely high productivity.

With the method for manufacturing a semiconductor device according to the second invention, in addition to the effect of the first invention, the temporary fixing strength of the semiconductor elements and the circuit board is increased by forming the ultraviolet curing part on the adhesive when the semiconductor element is temporarily fixed on one surface of the circuit board, whereby it is possible to positively prevent the semiconductor element from being displaced from one of the surfaces of the circuit board when the circuit board which has been completed with mounting of the semiconductor element on one surface thereof is reversed upside down and when the semiconductor element is mounted on the other surface of the circuit board.

With the apparatus for manufacturing a semiconductor device according to the present invention, the suction head integrally comprises the ultraviolet irradiator, whereby it is possible to form the ultraviolet curing part in the mixed curing adhesive applied to the other surface of the circuit board without the necessity for a step of conveying the circuit board to the ultraviolet irradiation step, resulting in higher productivity. Hence, it is possible to more positively prevent the semiconductor elements from being displaced from the circuit board, thereby further increasing the reliability of the joints between the bumps and the board electrodes.

DESCRIPTION OF THE PREFERRED EMBODIMENTS

Figure 1:
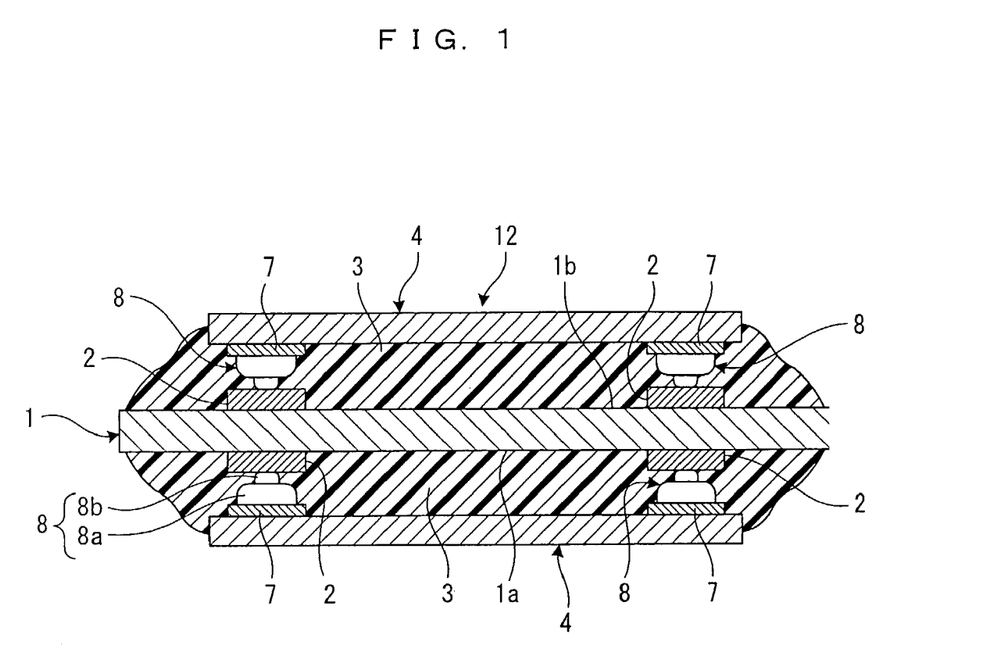
FIG. 1 is a longitudinal sectional view showing a semiconductor device manufactured by a manufacturing method of the present invention.

Hereinafter, preferred embodiments of the present invention will be discussed in accordance with the accompanied drawings. FIG. 1 is a longitudinal sectional view showing a semiconductor bare chip mounted module (semiconductor device) 12 which can be manufactured by the manufacturing method of the present invention. In FIG. 1, members which are identical to or the same as those of FIG. 5 are indicated by the same reference numerals. In the semiconductor bare chip mounted module 12, a circuit board 1 has just a small warp of about 20 $\mu$m and accordingly stud bumps 8 of semiconductor bare chips 4 and board electrodes 2 of the circuit board 1 are electrically connected to each other while being accurately positioned without displacements. Next, the following will discuss a method for manufacturing the semiconductor bare chip mounted module 12.

Figure 2A:
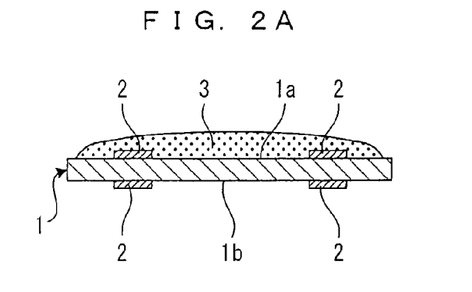
FIGS. 2A to 2G are longitudinal sectional views showing, in a sequential order, manufacturing processes for embodying a method for manufacturing a semiconductor device according to Embodiment 1 of the present invention.

FIGS. 2A to 2G are longitudinal sectional views showing a manufacturing process in the order of steps for embodying the method for manufacturing the semiconductor device according to Embodiment 1 of the present invention. In FIGS. 2A to 2G, the same members as those of FIG. 1 are indicated by the same reference numerals. First, as shown in FIG. 2A, a thermosetting adhesive 3 made of epoxy is applied to a first mounting surface 1a of the circuit board 1. The board electrodes 2 are formed on prescribed positions of circuits on both surfaces of the circuit board 1. At this point, the thermosetting adhesive 3 is applied so as to cover the board electrodes 2 of the first mounting surface 1a. In this case, as the applied adhesive 3, any adhesives containing conductive particles or any insulating adhesives are applicable and any of liquid adhesives and film-type solid adhesives are also applicable.

Figure 2B:
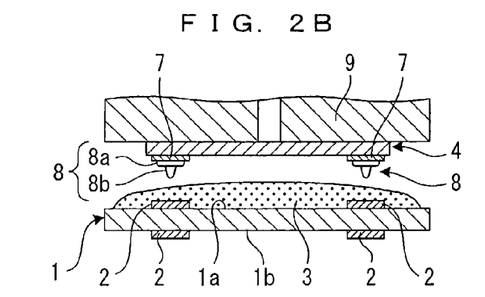
Figure 2C:
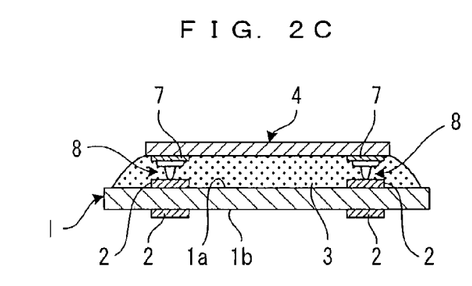

Meanwhile, as shown in FIG. 2B, on a semiconductor bare chip 4 to be mounted, stud bumps 8 of two-stepped protrusions are formed on electrode pads 7 provided on a surface of the semiconductor bare chip 4. The stud bump 8 has a bump base 8a which is fused with the material of the electrode pad 7 so as to be firmly fixed as an alloy on the electrode pad 7 and a bump head 8b which is formed on the bump base 8a. The semiconductor bare chip 4 is sucked and held by a vacuum suction head 9 and is conveyed over the circuit board 1, and then, the semiconductor bare chip 4 is lightly pressed onto the thermosetting adhesive 3 in a state that the stud bumps 8 are aligned with the board electrodes 2. Thereafter, as shown in FIG. 2C, the semiconductor bare chip 4 is temporarily fixed on the first mounting surface 1a via the adhesive 3.

Figure 2D:
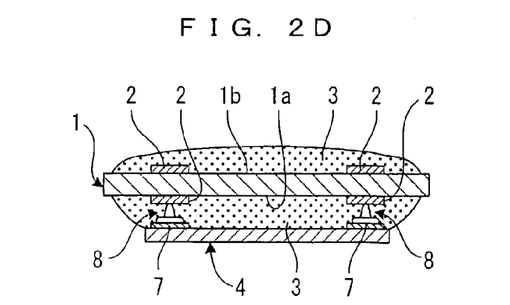
Figure 2E:
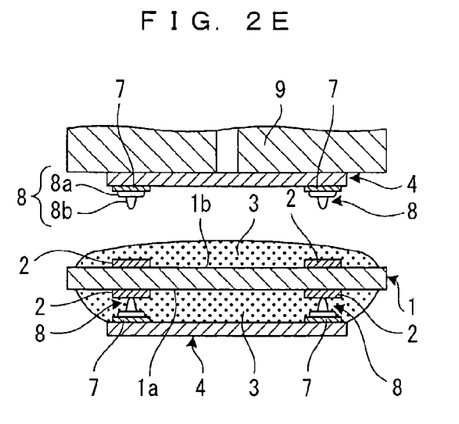

As shown in FIG. 2D, the circuit board 1 having the semiconductor bare chip 4 temporarily fixed on the first mounting surface 1a is reversed upside down, and then, the thermosetting adhesive 3 is applied to a second mounting surface 1b serving as the upper surface. Thereafter, as shown in FIG. 2E, another semiconductor bare chip 4 which is sucked and held by the vacuum suction head 9 is conveyed over the second mounting surface 1b of the circuit board 1. The semiconductor bare chip 4 is lightly pressed onto the thermosetting adhesive 3 in a state that the stud bumps 8 are aligned with the board electrodes 2, and the semiconductor bare chip 4 is temporarily fixed on the second mounting surface 1b via the adhesive 3.

Figure 2F:
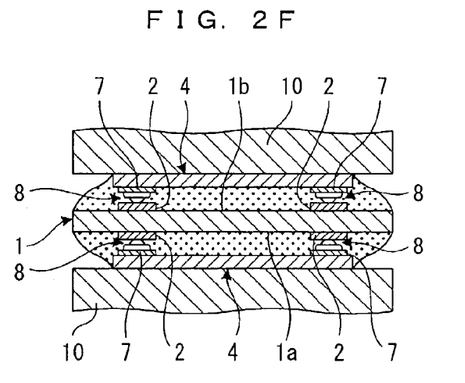
Figure 2G:
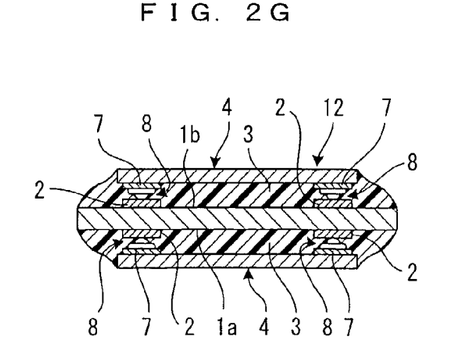

The circuit board 1 having the semiconductor bare chips 4 temporarily fixed thus on the first and second mounting surfaces 1a and 1b is conveyed to the subsequent step. As shown in FIG. 2F, the two semiconductor bare chips 4 temporarily fixed on the first and second mounting surfaces 1a and 1b of the circuit board 1 are heated while being pressed by a pressure-heating head 10 from both surfaces of the circuit board 1 for about thirty seconds. At this moment, it is preferable to apply a pressurizing load of 20 gf or more to each of the bumps 8 formed on the semiconductor bare chips 4 and to simultaneously perform leveling of bumps and correction of a warp. Thus, as shown in FIG. 2G, the thermosetting adhesive 3 applied to the mounting surfaces 1a and 1b of the circuit board 1 is thermally set and contracted at the same time, and the contraction force permits the two semiconductor bare chips 4 to be entirely attracted to the opposing mounting surfaces 1a and 1b of the circuit board 1, and the bump heads 8b of the stud bumps 8 are press-bonded and electrically connected to the corresponding board electrodes 2. Moreover, the semiconductor bare chips 4 are firmly bonded to the mounting surfaces 1a and 1b via the adhesive 3 which is filled entirely into gaps between the semiconductor bare chips 4 and the opposing mounting surfaces 1a and 1b of the circuit board 1 and is thermally set in the gaps. In this way, the semiconductor bare chip mounted module 12 of FIG. 1 is completed.

In the above-described manufacturing method, since the thermosetting adhesive 3 for temporarily fixing the semiconductor bare chips 4 on the first and second mounting surfaces 1a and 1b of the circuit board 1 is heated and thermally set at the same time, the contraction forces in the resin of the adhesive 3 are applied evenly on the mounting surfaces 1a and 1b of the circuit board 1 so that warps appear in opposite directions with respect to the circuit board 1 during the thermal setting, and thus the contraction forces cancel each other out. As a result, no warp appears on the circuit board 1.

Thus, upon mounting onto the second mounting surface 1b as well as the first mounting surface 1a, the semiconductor bare chips 4 can be temporarily fixed with no warp on the circuit board 1. Hence, the stud bumps 8 of the semiconductor bare chips 4 and the board electrodes 2 are electrically connected to each other with reliability while being aligned accurately without displacements on both of the first and second mounting surfaces 1a and 1b. Further, since it is possible to perform the press-bonding step of the semiconductor bare chips 4 while preventing the occurrence of a warp on the circuit board 1, no stress appears on joints between the stud bumps 8 and the board electrodes 2 on both of the mounting surfaces 1a and 1b, thereby preventing problems such as degradation in quality and bonding defects.

In addition, in the above-described manufacturing method, the semiconductor bare chips 4 can be temporarily fixed on the first and second mounting surfaces 1a and 1b of the circuit board 1 successively in the same step. Thus, compared with the conventional manufacturing method, it is possible to omit a conveying step for returning from the step of press-bonding the semiconductor bare chip 4 to the first mounting surface 1a by pressurizing and heating to the temporary fixing step in order to temporarily fix the semiconductor bare chip 4 on the second mounting surface 1b. Furthermore, the semiconductor bare chips 4 are simultaneously press-bonded to the first and second mounting surfaces 1a and 1b of the circuit board 1 by pressurizing and heating. Thus, compared with the conventional manufacturing method, this method requires just one press-bonding step. Hence, the above-described manufacturing method has the significant advantage that the semiconductor bare chip mounted module 12 can be manufactured with extremely high productivity.

FIGS. 3A to 3G are longitudinal sectional views showing a manufacturing process in the order of steps for embodying a method for manufacturing a semiconductor device according to Embodiment 2 of the present invention. In FIGS. 3A to 3G, the same members as those of FIG. 2 are indicated by the same reference numerals. Next, for easier understanding of the manufacturing process of the present embodiment, the steps discussed in Embodiment 1 are included in the following explanation.

Figures 3A, 3B, 3C, 3D, 3E, 3F, 3G:
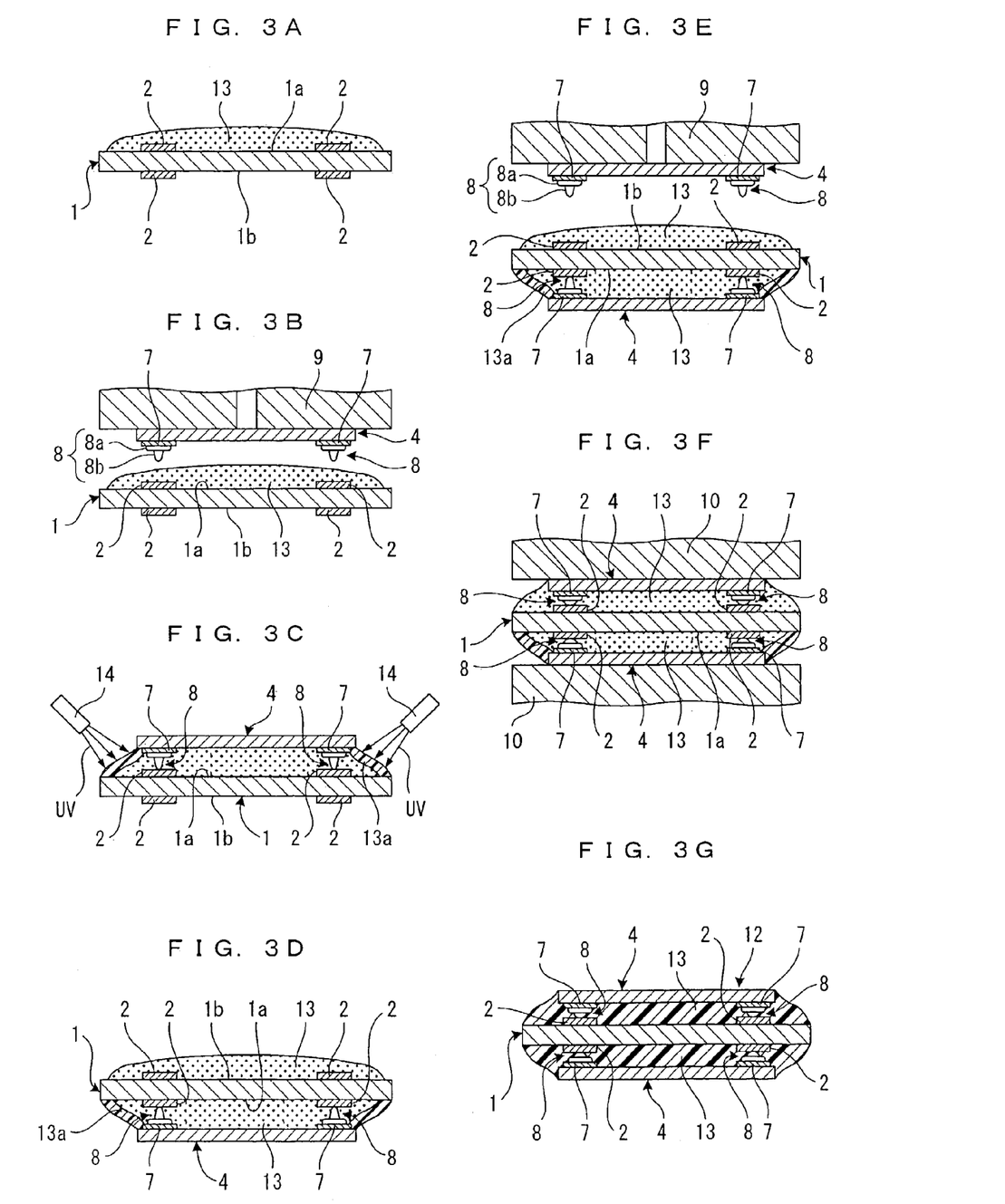
FIGS. 3A to 3G are longitudinal sectional views showing, in a sequential order, manufacturing processes for embodying a method for manufacturing a semiconductor device according to Embodiment 2 of the present invention.

First, as shown in FIG. 3A, a mixed curing adhesive 13 is applied to a first mounting surface 1a of a circuit board 1. The mixed curing adhesive 13 is made by mixing an ultraviolet curing adhesive with a thermosetting adhesive. At this moment, the mixed curing adhesive 13 is applied so as to cover board electrodes 2 of the first mounting surface 1a. Then, as shown in FIG. 3B, a semiconductor bare chip 4 is conveyed over the circuit board 1 while being sucked and held by a vacuum suction head 9. Thereafter, the semiconductor bare chip 4 is lightly pressed onto the mixed curing adhesive 13 while stud bumps 8 are aligned with the board electrodes 2. Then, temporary fixing is made as shown in FIG. 3C. When the vacuum suction head 9 is separated from the semiconductor bare chip 4 after completion of the temporary fixing, the circuit board 1 having the semiconductor bare chip 4 temporarily fixed on the first mounting surface 1a is transferred to an ultraviolet irradiation step. In the ultraviolet irradiation step, ultraviolet rays or UVs are irradiated from ultraviolet irradiators 14 to the circumference of the mixed curing adhesive 13 outside the semiconductor bare chip 4. Thus, an ultraviolet curing part 13a is formed on the circumference of the mixed curing adhesive 13 to increase the temporary fixing strength between the semiconductor bare chip 4 and the circuit board 1.

As shown in FIG. 3D, the circuit board 1 having the semiconductor bare chip 4 temporarily fixed on the first mounting surface 1a is reversed upside down. Thereafter, the mixed curing adhesive 13 is applied to a second mounting surface 1b serving as the upper surface of the circuit board 1. Subsequently, as shown in FIG. 3E, another semiconductor bare chip 4 which is sucked and held by the vacuum suction head 9 is conveyed over the second mounting surface 1b of the circuit board 1. Then, as shown in FIG. 3F, the semiconductor bare chip 4 is lightly pressed onto the mixed curing adhesive 13 and is temporarily fixed in a state that the stud bumps 8 are aligned with the board electrodes 2. Besides, after the semiconductor bare chip 4 is temporarily fixed on the second mounting surface 1b, as with the first mounting surface 1a, ultraviolet rays may be applied to the circumference of the mixed curing adhesive 13 on the second mounting surface 1b to form an ultraviolet curing part 13a. When the ultraviolet curing part 13a is not formed, instead of the mixed curing adhesive 13, the thermosetting adhesive 3 used in Embodiment 1 may be applied to the second mounting surface 1b.

The circuit board 1 having the semiconductor bare chips 4 temporarily fixed thus on the first and second mounting surfaces 1a and 1b is conveyed to the subsequent step. As shown in FIG. 3F, the two semiconductor bare chips 4 temporarily fixed on the first and second mounting surfaces 1a and 1b of the circuit board 1 are heated while being pressed by a pressure-heating head 10 from both surfaces of the circuit board 1 for about thirty seconds. At this moment, it is preferable to apply a pressurizing load of 20 gf or more to each of the bumps 8 formed on the semiconductor bare chips 4 and to simultaneously perform leveling of bumps and correction of a warp.

Thus, as shown in FIG. 3G, the mixed curing adhesive 13 applied to the mounting surfaces 1a and 1b of the circuit board 1 is thermally set and contracted at the same time, the contraction force permits the two semiconductor bare chips 4 to be entirely attracted to the opposing mounting surfaces 1a and 1b of the circuit board 1, and bump heads 8b of the stud bumps 8 are press-bonded and electrically connected to the corresponding board electrodes 2. Moreover, the semiconductor bare chips 4 are firmly bonded to the mounting surfaces 1a and 1b via the adhesive 3 which is filled entirely into gaps between the semiconductor bare chip 4 and the opposing mounting surfaces 1a and 1b of the circuit board 1 and is thermally set in the gaps. Thus, a semiconductor bare chip mounted module 12 is completed.

The above-described manufacturing method can obtain the same effect as Embodiment 1. Namely, since the mixed curing adhesive 13 for temporarily fixing the semiconductor bare chips 4 on the first and second mounting surfaces 1a and 1b of the circuit board 1 is simultaneously heated and thermally set, contraction forces in the resin of the adhesive 13 are applied evenly on the mounting surfaces 1a and 1b of the circuit board 1 so that warps appear in opposite directions with respect to the circuit board 1 during the thermal setting, and thus the contraction forces cancel each other out. As a result, no warp appears on the circuit board 1.

Thus, upon mounting onto the second mounting surface 1b as well as the first mounting surface 1a, the semiconductor bare chips 4 can be temporarily fixed with no warp on the circuit board 1. Hence, the stud bumps 8 of the semiconductor bare chips 4 and the board electrodes 2 are electrically connected to each other with reliability while being aligned accurately without displacements on both of the first and second mounting surfaces 1a and 1b. Further, since it is possible to perform the press-bonding step of the semiconductor bare chips 4 while preventing the occurrence of a warp on the circuit board 1, no stress appears on joints between the stud bumps 8 and the board electrodes 2 on both of the mounting surfaces 1a and 1b, thereby preventing problems such as degradation in quality and bonding defects.

In addition, in the above-described manufacturing method, the semiconductor bare chips 4 can be temporarily fixed on the first and second mounting surfaces 1a and 1b of the circuit board 1 successively in the same step, compared with the conventional manufacturing method, it is possible to omit a conveying step of returning from the step of press-bonding the semiconductor bare chip 4 to the first mounting surface 1a by pressurizing and heating to the temporary fixing step in order to temporarily fix the semiconductor bare chip 4 on the second mounting surface 1b. Furthermore, the semiconductor bare chips 4 are simultaneously press-bonded to the first and second mounting surfaces 1a and 1b of the circuit board 1 by pressurizing and heating. Thus, as compared with the conventional manufacturing method, this method requires just one press-bonding step. Hence, with the above manufacturing method, the semiconductor bare chip mounted module 12 can be manufactured with extremely high productivity.

In this embodiment, in addition to the effect of Embodiment 1, the ultraviolet rays are irradiated to the circumference of the mixed curing adhesive 13 to form the ultraviolet curing part 13a after the semiconductor bare chip 4 is temporarily fixed on the first mounting surface 1a of the circuit board 1. Thus, since the ultraviolet curing part 13a increases the temporary fixing strength of the semiconductor bare chips 4 and the circuit board 1, it is possible to positively prevent the semiconductor bare chip 4 from being displaced from the first mounting surface 1a of the circuit board 1 when the circuit board 1 having completed mounting of the semiconductor bare chip 4 on the first mounting surface 1a is reversed upside down and when another semiconductor bare chip 4 is mounted on the second mounting surface 1b. Here, when the mixed curing adhesive 13 is applied to the surfaces 1a and 1b of the circuit board 1 to form the ultraviolet curing parts 13a on both of the surfaces 1a and 1b of the circuit board 1, it is possible to more positively prevent displacements of the semiconductor bare chips 4 from the circuit board 1.

FIGS. 4A to 4G are longitudinal sectional views showing a manufacturing process in the order of steps for embodying a method for manufacturing a semiconductor device according to Embodiment 3 of the present invention. In FIGS. 3A to 3G, the same members as those of FIG. 3 are indicated by the same reference numerals. Next, for easier understanding of the manufacturing process of the present embodiment, the steps discussed in Embodiment 2 are included in the following explanation.

Figure 4A:
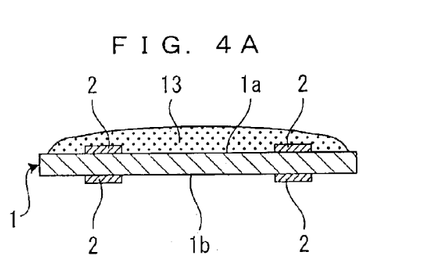
FIGS. 4A to 4G are longitudinal sectional views showing, in a sequential order, manufacturing processes for embodying a method for manufacturing a semiconductor device according to Embodiment 3 of the present invention.
Figure 4B:
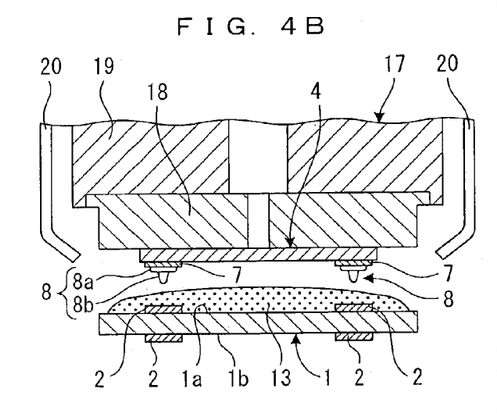
Figure 4C:
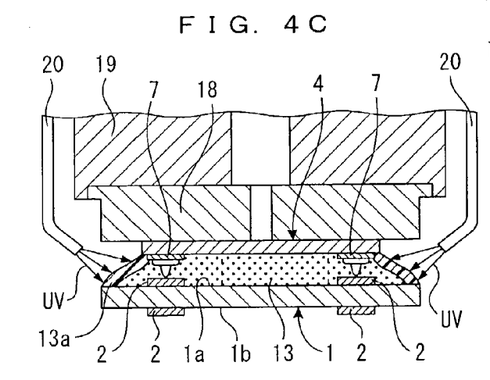

First, as shown in FIG. 4A, a mixed curing adhesive 13 is applied to a first mounting surface 1a of a circuit board 1. The mixed curing adhesive 13 is made by mixing an ultraviolet curing adhesive with a thermosetting adhesive. At this moment, the mixed curing adhesive 13 is applied so as to cover board electrodes 2 of the first mounting surface 1a. Then, as shown in FIG. 4B, a semiconductor bare chip 4 is conveyed over the circuit board 1 while being sucked and held by a tool 18 of a combined vacuum suction head 17. Thereafter, the semiconductor bare chip 4 is lightly pressed onto the mixed curing adhesive 13 while stud bumps 8 are aligned with the board electrodes 2. Then, temporary fixing is made as shown in FIG. 4C. Concurrently with the temporary fixing step, ultraviolet rays are irradiated from an ultraviolet irradiator 20 to the circumference of the mixed curing adhesive 13 outside the semiconductor bare chip 4. The ultraviolet irradiator 20 is mounted on a holder 19 of the combined vacuum suction head 17. Thus, an ultraviolet curing part 13a is formed on the circumference of the mixed curing adhesive 13 to increase the temporary fixing strength of the semiconductor bare chip 4 and the circuit board 1.

Figure 4D:
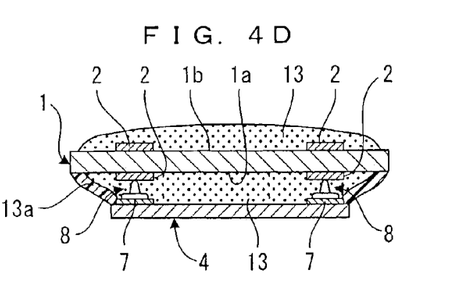
Figure 4E:
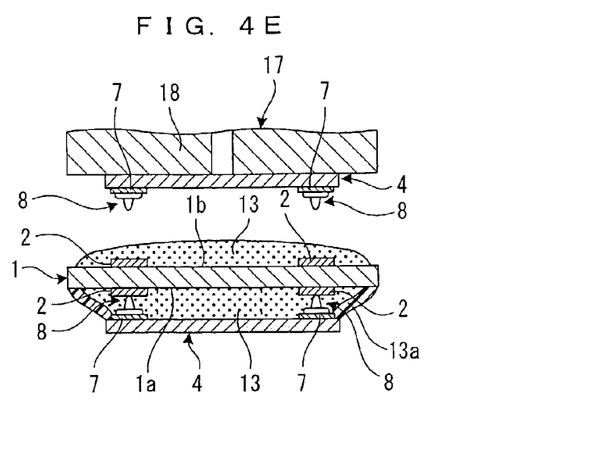

As shown in FIG. 4D, the circuit board 1 having the semiconductor bare chip 4 temporarily fixed on the first mounting surface 1a is reversed upside down in the same step. Thereafter, the mixed curing adhesive 13 is applied to a second mounting surface 1b serving as the upper surface of the circuit board 1. Subsequently, as shown in FIG. 4E, another semiconductor bare chip 4 which is sucked and held by the combined vacuum suction head 17 is conveyed over the second mounting surface 1b of the circuit board 1. As with FIG. 4C, the semiconductor bare chip 4 is lightly pressed onto the mixed curing adhesive 13 and is temporarily fixed in a state that the stud bumps 8 are aligned with the board electrodes 2. Besides, when the semiconductor bare chip 4 which is sucked and held by the combined vacuum suction head 17 is temporarily fixed on the second mounting surface 1b, as with the first mounting surface 1a, ultraviolet rays may be applied to the circumference of the mixed curing adhesive 13 from the ultraviolet irradiator 20 of the combined vacuum suction head 17 to form the ultraviolet curing part 13a. When the ultraviolet curing part 13a is not formed, instead of the mixed curing adhesive 13, the thermosetting adhesive 3 used in Embodiment 1 may be applied to the second mounting surface 1b.

Figure 4F:
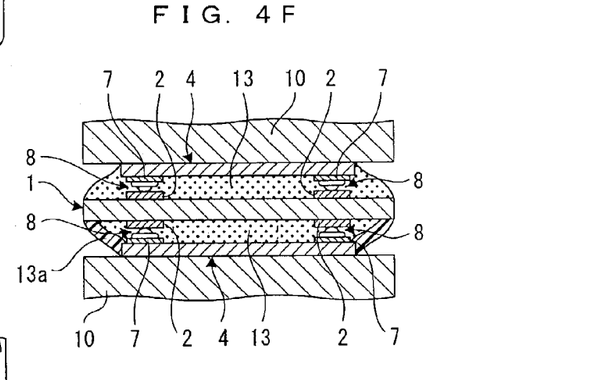

As described above, the circuit board 1 having the semiconductor bare chips 4 temporarily fixed on the first and second mounting surfaces 1a and 1b is conveyed to the subsequent step. As shown in FIG. 4F, the two semiconductor bare chips 4 temporarily fixed on the first and second mounting surfaces 1a and 1b of the circuit board 1 are heated while being pressed by a pressure-heating head 10 from both surfaces of the circuit board 1 for about thirty seconds. At this moment, it is preferable to apply a pressurizing load of 20 gf or more to each of the bumps 8 formed on the semiconductor bare chips 4 and to simultaneously perform leveling and correction of a warp.

Figure 4G:
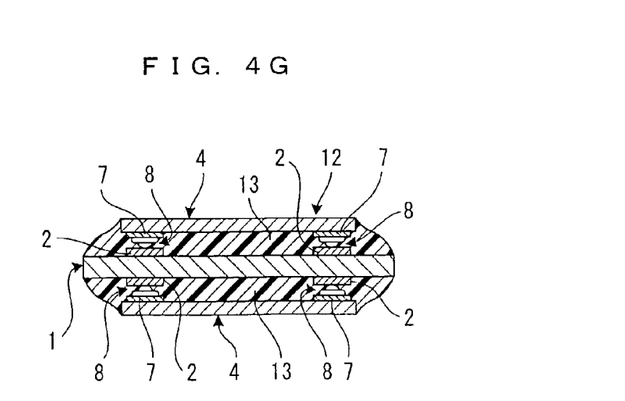

Thus, as shown in FIG. 4G, the mixed curing adhesive 13 applied to the mounting surfaces 1a and 1b of the circuit board 1 is thermally set and contracted at the same time, the contraction force permits the two semiconductor bare chips 4 to be entirely attracted to the opposing mounting surfaces 1a and 1b of the circuit board 1, and bump heads 8b of the stud bumps 8 are press-bonded and electrically connected to the corresponding board electrodes 2. Moreover, the semiconductor bare chips 4 are firmly bonded to the mounting surfaces 1a and 1b via the adhesive 3 which is filled entirely into gaps between the semiconductor bare chip 4 and the opposing mounting surfaces 1a and 1b of the circuit board 1 and is thermally set in the gaps. Thus, a semiconductor bare chip mounted module 12 is completed.

The above-described manufacturing method can obtain the same effect as Embodiment 2. Namely, since the mixed curing adhesive 13 for temporarily fixing the semiconductor bare chips 4 on the first and second mounting surfaces 1a and 1b of the circuit board 1 is simultaneously heated and thermally set, contraction forces in the resin of the adhesive 13 are applied evenly on the mounting surfaces 1a and 1b of the circuit board 1 so that a warp appears in opposing directions with respect to the circuit board 1 during the thermal setting, and thus the contraction forces cancel each other out. As a result, no warp appears on the circuit board 1.

Thus, upon mounting onto the second mounting surface 1b as well as the first mounting surface 1a, the semiconductor bare chips 4 can be temporarily fixed with no warp on the circuit board 1. Hence, the stud bumps 8 of the semiconductor bare chips 4 and the board electrodes 2 are electrically connected to each other with reliability while being aligned accurately without displacements on both of the first and second mounting surfaces 1a and 1b. Further, since it is possible to perform the press-bonding step of the semiconductor bare chips 4 while preventing the occurrence of a warp on the circuit board 1, no stress appears on joints between the stud bumps 8 and the board electrodes 2 on both of the mounting surfaces 1a and 1b, thereby preventing problems such as degradation in quality and bonding defects.

In addition, in the above-described manufacturing method, the semiconductor bare chips 4 can be temporarily fixed on the first and second mounting surfaces 1a and 1b of the circuit board 1 successively in the same step, compared with the conventional manufacturing method, it is possible to omit a conveying step of returning from the step of press-bonding the semiconductor bare chip 4 to the first mounting surface 1a by pressurizing and heating to the temporary fixing step in order to temporarily fix the semiconductor bare chip 4 on the second mounting surface 1b. Furthermore, the semiconductor bare chips 4 are simultaneously press-bonded to the first and second mounting surfaces 1a and 1b of the circuit board 1 by pressurizing and heating. Thus, compared with the conventional manufacturing method, this method requires just one press-bonding step. Hence, with the above manufacturing method, the semiconductor bare chip mounted module 12 can be manufactured with extremely high productivity.

Further, after the semiconductor bare chip 4 is temporarily fixed on the first mounting surface 1a of the circuit board 1, the ultraviolet rays are irradiated to the circumference of the mixed curing adhesive 13 to form the ultraviolet curing part 13a. Since the ultraviolet curing part 13a increases the temporary fixing strength of the semiconductor bare chips 4 and the circuit board 1, it is possible to positively prevent the semiconductor bare chip 4 from being displaced from the first mounting surface 1a of the circuit board 1 when the circuit board 1 having completed mounting of the semiconductor bare chip 4 on the first mounting surface 1a is reversed upside down and when the semiconductor bare chip 4 is mounted on the second mounting surface 1b.

In this embodiment, in addition to the effect of Embodiment 2, it is possible to irradiate the ultraviolet rays while the semiconductor bare chips 4 are temporarily fixed by using the combined vacuum suction head 17 including the ultraviolet irradiator 20. Hence, compared with Embodiment 2, it is not necessary to transfer the circuit board 1 having completed temporary fixing of the semiconductor bare chip 4 on the first mounting surface 1a to the ultraviolet irradiation step, and thus the productivity can be improved accordingly. Further, it is possible to eliminate the possibility that an impact at the transfer to the ultraviolet irradiation step causes displacements of the temporarily fixed semiconductor bare chips 4 from the circuit board 1, thereby further increasing the reliability of the joints. Since the combined vacuum suction head 17 integrally comprises the ultraviolet irradiator 20, it is possible to form the ultraviolet curing part 13a on the mixed curing adhesive 13 of the second mounting surface 1b without the necessity for a conveying step to the ultraviolet irradiation step. In this case, it is possible to more positively prevent the semiconductor bare chips 4 from being displaced from the circuit board 1, thereby further increasing the reliability of the joints.

What is claimed is:

1. A method for manufacturing a semiconductor device comprising a circuit board, adhesive bonded semiconductor elements on both surfaces of the board, and adhesive interposed between the semiconductor elements and the board, said method comprising:

applying a first thermosetting adhesive to one surface of a circuit board, temporarily fixing a semiconductor element on the surface via the first adhesive so that bumps on the semiconductor element are aligned with electrodes on the circuit board, reversing upside down the circuit board having the semiconductor element temporarily fixed thereon, applying second thermosetting adhesive to the other surface of the circuit board, temporarily fixing another semiconductor element on the other surface via the second adhesive so that bumps on the another semiconductor element are aligned with board electrodes on the circuit board, and thermally setting the first and second adhesives simultaneously on both surfaces of the circuit board by heating the semiconductor elements temporarily fixed on both surfaces of the circuit board while applying pressure thereto in directions of pressing each semiconductor elements against the circuit board, and press-bonding the bumps on the semiconductor elements to the opposing electrodes on the circuit board so that said bumps and said electrodes are electrically connected.

2. The method for manufacturing a semiconductor device according to claim 1, wherein when the semiconductor elements are heated while being applied with pressure in directions of pressing each semiconductor element against the circuit board, the method further comprises the step of applying pressure of at least 20 gf to each of the bumps located on the semiconductor elements, setting the first and second adhesives interposed between the semiconductor elements and the circuit board by the heat while leveling the bumps and correcting a warp on the board simultaneously, and press-bonding the bumps on the semiconductor elements to the opposing board electrodes on the circuit board into an electrically connected state.

3. A method for manufacturing a semiconductor device, comprising the steps of:

applying a mixed curing adhesive to one surface of a circuit board, the adhesive being made by mixing a thermosetting adhesive and an ultraviolet curing adhesive, temporarily fixing a semiconductor element on the surface via the adhesive in a state that bumps on the semiconductor element are aligned with board electrodes on the circuit board, forming an ultraviolet curing part only on a circumference of the adhesive by irradiating the circumference of the adhesive with ultraviolet rays, reversing upside down the circuit board having the semiconductor element temporarily fixed thereon, applying a thermosetting adhesive to the other surface of the circuit board, temporarily fixing another semiconductor element on the other surface via the thermosetting adhesive in a state that bumps on the another semiconductor element are aligned with board electrodes on the circuit board, and thermally setting the adhesive simultaneously on both surfaces of the circuit board by heating the semiconductor elements temporarily fixed on both surfaces of the circuit board while applying pressure thereto in directions of pressing each semiconductor elements against the circuit board, and press-bonding the bumps on the each semiconductor elements to the opposing board electrodes on the circuit board into an electrically connected state.

4. The method for manufacturing a semiconductor device according to claim 3, wherein instead of the thermosetting adhesive, the mixed curing adhesive made by mixing a thermosetting adhesive and an ultraviolet curing adhesive is applied to the other surface of the circuit board, another semiconductor element is temporarily fixed on the other surface via the mixed curing adhesive, and then, ultraviolet rays are irradiated to a circumference of the mixed curing adhesive to form an ultraviolet curing part only on the circumference of the adhesive.

5. The method for manufacturing a semiconductor device according to claim 3, wherein the step of temporarily fixing the semiconductor element on at least one surface of the circuit board via the mixed curing adhesive and the step of irradiating ultraviolet rays to the circumference of the mixed curing adhesive to form the ultraviolet curing part are simultaneously performed.

* * * * *